United States Patent
Dubeyko et al.

(10) Patent No.: US 11,579,770 B2
(45) Date of Patent: Feb. 14, 2023

(54) VOLATILITY MANAGEMENT FOR MEMORY DEVICE

(71) Applicant: Western Digital Technologies, Inc., San Jose, CA (US)

(72) Inventors: Viacheslav Dubeyko, San Jose, CA (US); Luis Cargnini, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/922,007

(22) Filed: Mar. 15, 2018

(65) Prior Publication Data

US 2019/0286325 A1   Sep. 19, 2019

(51) Int. Cl.
  *G06F 3/06*   (2006.01)
  *G11C 14/00*   (2006.01)

(52) U.S. Cl.
  CPC .......... *G06F 3/0604* (2013.01); *G06F 3/0646* (2013.01); *G06F 3/0679* (2013.01); *G11C 14/0009* (2013.01)

(58) Field of Classification Search
  CPC .... G06F 3/0604; G06F 3/0646; G06F 3/0679; G11C 14/00; G11C 14/0009
  USPC .................................................. 711/105, 103
  See application file for complete search history.

(56) References Cited

U.S. PATENT DOCUMENTS

| | | | |
|---|---|---|---|
| 5,640,533 A | 6/1997 | Hays et al. | |
| 5,680,570 A | 10/1997 | Rantala et al. | |
| 6,101,599 A | 8/2000 | Wright et al. | |
| 6,560,674 B1 | 5/2003 | Hosogi et al. | |
| 7,979,632 B2 | 7/2011 | Alvarez et al. | |
| 8,209,488 B2 | 6/2012 | Arimilli et al. | |
| 8,437,188 B2 | 5/2013 | Kajigaya | |
| 9,081,660 B2 | 7/2015 | Thomas | |
| 9,128,824 B2 | 9/2015 | Gries et al. | |
| 10,163,502 B2 * | 12/2018 | Connor | G11C 13/0004 |
| 10,210,167 B1 | 2/2019 | Sorenson, III | |

(Continued)

FOREIGN PATENT DOCUMENTS

EP  3293638 A1  3/2018

OTHER PUBLICATIONS

Written Opinion dated Apr. 17, 2019 from counterpart International Application No. PCT/US2018/067121, 6 pages.

(Continued)

*Primary Examiner* — Pierre Michel Bataille
(74) *Attorney, Agent, or Firm* — Barry IP Law, P.C.

(57) ABSTRACT

A Memory Device (MD) for storing temporary data designated for volatile storage by a processor and persistent data designated for non-volatile storage by the processor. An address is associated with a first location in a volatile memory array and with a second location in a Non-Volatile Memory (NVM) array of the MD. Data is written in the first location, and flushed from the first location to the second location. A refresh rate for the first location is reduced after flushing the data from the first location until after data is written again to the first location. In another aspect, a processor designates a memory page in a virtual memory space as volatile or non-volatile based on data allocated to the memory page, and defines the volatility mode for the MD based on whether the memory page is designated as volatile or non-volatile.

27 Claims, 10 Drawing Sheets

(56) References Cited

U.S. PATENT DOCUMENTS

| | | | |
|---|---|---|---|
| 10,606,513 B2 | 3/2020 | Dubeyko et al. | |
| 2005/0132363 A1 | 6/2005 | Tewari et al. | |
| 2005/0169084 A1 | 8/2005 | Matsui | |
| 2007/0053220 A1* | 3/2007 | Gohou | G11C 11/22 365/145 |
| 2007/0113044 A1 | 5/2007 | Day et al. | |
| 2007/0174718 A1 | 7/2007 | Fouquet-Lapar | |
| 2008/0010442 A1 | 1/2008 | Hochschild et al. | |
| 2008/0065832 A1 | 3/2008 | Srivastava et al. | |
| 2008/0205146 A1* | 8/2008 | Kajigaya | G11C 14/00 365/185.08 |
| 2010/0115204 A1 | 5/2010 | Li et al. | |
| 2010/0223305 A1 | 9/2010 | Park et al. | |
| 2011/0113208 A1* | 5/2011 | Jouppi | G06F 11/1438 711/162 |
| 2013/0212321 A1* | 8/2013 | Talagala | G06F 12/0246 711/103 |
| 2013/0332660 A1* | 12/2013 | Talagala | G06F 12/0246 711/103 |
| 2014/0006686 A1* | 1/2014 | Chen | G06F 3/0611 711/102 |
| 2014/0281269 A1 | 9/2014 | Chakrabarti et al. | |
| 2014/0281682 A1* | 9/2014 | Manohar | G11C 29/52 714/6.11 |
| 2015/0095563 A1 | 4/2015 | Royer, Jr. | |
| 2015/0121105 A1 | 4/2015 | Ahn et al. | |
| 2015/0162063 A1* | 6/2015 | Mueller | G11C 11/221 365/145 |
| 2015/0178164 A1* | 6/2015 | Zhang | G06F 11/1435 714/20 |
| 2015/0206574 A1* | 7/2015 | Greathouse | G06F 13/1636 711/103 |
| 2015/0227470 A1* | 8/2015 | Brandt | G06F 12/1036 711/207 |
| 2015/0331624 A1 | 11/2015 | Law | |
| 2016/0034225 A1 | 2/2016 | Yoon et al. | |
| 2016/0170645 A1 | 6/2016 | Kumar et al. | |
| 2017/0123872 A1* | 5/2017 | Yigzaw | G06F 11/079 |
| 2017/0212687 A1* | 7/2017 | Kelly | G06F 1/3225 |
| 2018/0173626 A1* | 6/2018 | Banerjee | G06F 12/0835 |
| 2018/0329818 A1 | 11/2018 | Cheng et al. | |

OTHER PUBLICATIONS

Dubeyko et al., co-pending U.S. Appl. No. 15/833,837, filed Dec. 6, 2017, entitled "Volatility Management for Non-Volatile Memory Device".

Bhati et al.; "DRAM Refresh Mechanisms, Penalties, and Trade-Offs"; Jan. 2016; 14 pages; vol. 65; No. 1; IEEE Transactions on Computers; available at https://ieeexplore.ieee.org/document/7070756.

Bhati et al.; "Flexible Auto-Refresh: Enabling Scalable and Energy-Efficient DRAM Refresh Reductions"; Jun. 13-17, 2015; 12 pages; available athttps://ieeexplore.ieee.org/document/7284069.

International Search Report and Written Opinion dated Jul. 4, 2019 from counterpart International Application No. PCT/US2019/024221, 8 pages.

Pending U.S. Appl. No. 16/001,635, filed Jun. 6, 2018, entitled "Processor for Improved Process Switching and Methods Thereof", Viacheslav Dubeyko.

* cited by examiner

VOLATILITY MANAGEMENT FOR MEMORY DEVICE

BACKGROUND

Conventional memory architecture generally distinguishes between two types of memory. The first type of memory is volatile memory that can only store data while power is supplied to the memory. The second type of memory is Non-Volatile Memory (NVM) that retains data without being powered. NVM, such as Hard Disk Drives (HDDs) or NAND flash memory, is typically considered to take longer to read and write data than volatile memory. Persistently stored data is conventionally transferred from NVM to volatile memory to perform operations on the data. The modified data or other resulting data is then transferred or flushed back to the NVM to be persistently stored.

In the example of an Operating System (OS), a volatile memory such as a Dynamic Random Access Memory (DRAM) may be used by the OS when executing a process or a thread, such as a subset of instructions in a process. The OS may create a byte-addressable, virtual address space that maps to locations in the DRAM for receiving data from files stored in the NVM. The data can be copied to memory pages of a fixed size in the address space that is accessed by a processor, such as a Central Processing Unit (CPU).

The use of volatile memory to perform write operations can ordinarily allow for faster performance of write operations as compared to most conventional NVM technologies. In addition, volatile memory typically has a better endurance than most conventional NVM technologies for how many times data can be rewritten to particular portions of the memory (e.g., cells). For example, the usable life of a Multi-Level Cell (MLC) flash block may be limited to 10,000 Program Erase (PE) cycles. Despite these advantages, most volatile memory typically requires power to continually refresh data or a larger amount of power to be supplied to the volatile memory so that the volatile memory can retain its data. This refreshing can significantly add to the overall power requirements of the device that includes the volatile memory.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

Example System Overview

Figure 1:
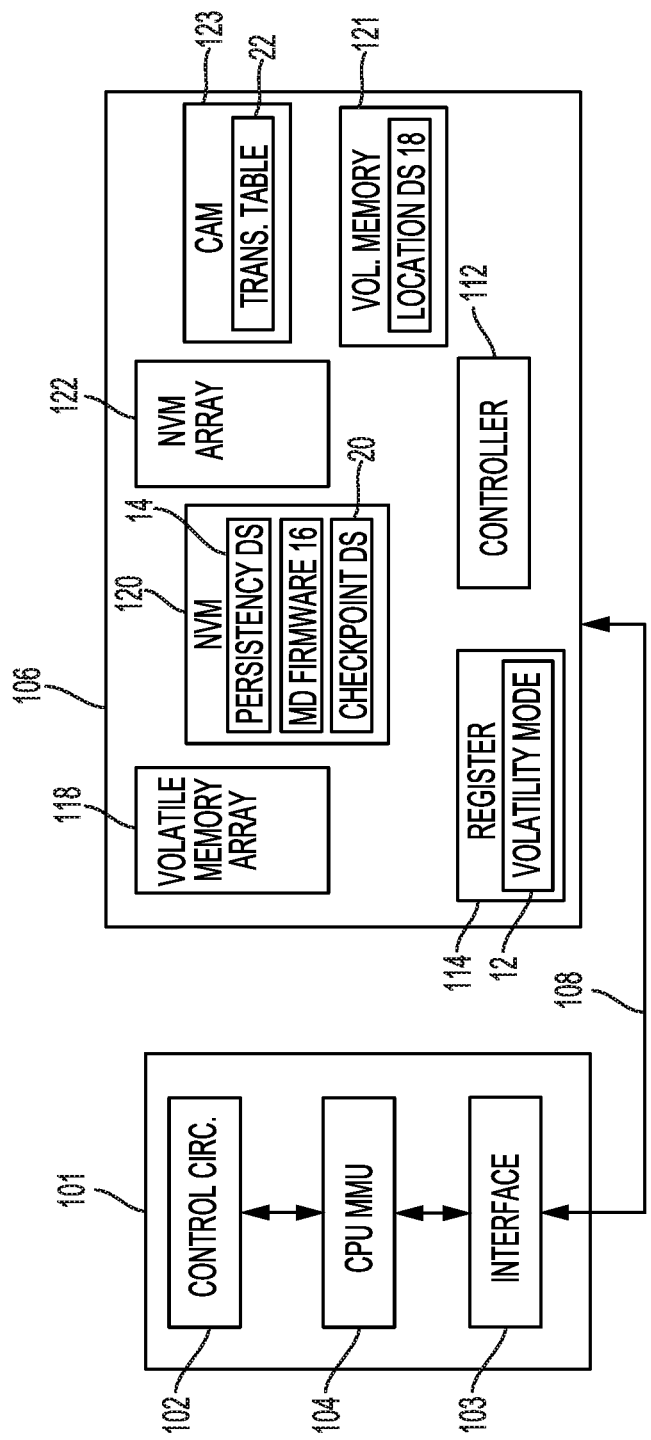
FIG. 1 is a block diagram of a Central Processing Unit (CPU) and a Memory Device (MD) according to an embodiment.

FIG. 1 is a block diagram of Central Processing Unit (CPU) 101 and Memory Device (MD) 106 according to an embodiment. In this disclosure, a CPU is used as a specific example of a processor to illustrate various embodiments, and these embodiments can be generally applied to various types of processors, including, for example, a CPU, a Microprocessor (MPU), or a Microcontroller (MCU). The processor may also be part of a System on a Chip (SoC).

The example of CPU 101 in FIG. 1 includes control circuitry 102, interface 103, and CPU Memory Management Unit (MMU) 104. Control circuitry 102 performs operations on data accessed from MD 106. As will be appreciated by those of ordinary skill in the art, control circuitry 102 can include an Arithmetic Logic Unit (ALU) for performing operations, registers for storing instructions and results from the operations, and one or more caches (e.g., L1, L2, and L3 cache levels) for storing data used by the ALU. MMU 104 translates virtual addresses used by control circuitry 102 into physical addresses (e.g., byte addresses) indicating a location of where data for the virtual addresses are to be stored in or retrieved from MD 106. Interface 103 allows CPU 101 to communicate with MD 106 via bus 108.

As shown in FIG. 1, CPU 101 does not include a volatile Dynamic Random-Access Memory (DRAM) as a main memory. Instead, CPU 101 uses MD 106 as both a main memory and a non-volatile storage. As discussed in more detail below, MD 106 is configured to store temporary data designated for volatile storage by CPU 101 and persistent data designated for non-volatile storage by CPU 101. In this sense, MD 106 can be considered a "fuzzy NVM" device by providing both temporary and persistent data storage functions. In some embodiments, the processor, CPU 101, may be part of an SoC.

As shown in FIG. 1, MD 106 includes controller 112, register 114, volatile memory array 118, NVM 120, NVM array 122, Content-Addressable Memory (CAM) 123, and volatile memory 121. Controller 112 can include circuitry for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof. In some implementations, controller 112 can include an SoC. As discussed in more detail below, controller 112 serves as an MMU for MD 106 by determining whether to access data from volatile memory array 118 and/or NVM array 122 based on a volatility mode set for MD 106.

Register 114 can include, for example, a Magnetoresistive RAM (MRAM) or another type of relatively quick access memory, such as Static RAM (SRAM). In some implementations, register 114 may include a set of registers. Those of ordinary skill in the art will understand that register 114 and controller 112 may be combined as a single component in some implementations. In the example of FIG. 1, register 114 stores volatility mode 12 as a data structure that indicates a current volatility mode of operation for MD 106. The state of volatility mode 12 can affect how MD 106 performs operations. In other implementations, volatility mode 12 may be stored in a different memory location, such as NVM 120. As discussed in more detail below, CPU 101 or another device external to MD 106 can set volatility mode 12 to affect how read and write operations are performed in MD 106.

As discussed in more detail below, controller 112 can associate an address for data with a first location in volatile memory array 118 and with a second location in NVM array 122. Volatile memory array 118 can include, for example, an embedded DRAM (eDRAM) or other type of volatile memory that allows for faster write operations and/or longer write endurance as compared to NVM array 122. According to one aspect, data is first written to the first location in volatile memory array 118 to take advantage of its faster write performance, and then the written data is flushed or copied to the second location in NVM array 122. According to another aspect, a rate for refreshing the data is reduced in the first location in volatile memory array 118 after flushing the data until after data is again written to the first location. This arrangement ordinarily allows for a significant reduction in power consumed by MD 106, since additional power is not needed to refresh data in the first location in volatile memory array 118.

For example, in an implementation where volatile memory array 118 includes eDRAM, a periodic refresh is needed to retain the data since a stored charge in eDRAM cell leaks away. Although eDRAM can provide average read and write latencies of only 3 to 5 nanoseconds as compared to average read and write latencies of 20 to 30 nanoseconds for DRAM, the fast logic transistors of eDRAM have greater charge leakage than transistors used in DRAM. This results in a greater refresh rate than DRAM, such as a refresh rate of approximately every 40 microseconds for eDRAM, as compared to a refresh rate of approximately every 64 milliseconds for DRAM. The present disclosure, among other improvements to conventional memory systems, can provide the advantages of the lower access latencies associated with eDRAM, without the higher power requirements and refresh rates of eDRAM.

NVM array 122 can include an NVM, such as a flash memory or a non-volatile Storage Class Memory (SCM) (e.g., MRAM or ReRAM). In some implementations, the time to read data from NVM array 122 may be as fast or nearly as fast as the time to read data from volatile memory array 118, such that there may be little, if any, performance loss by reading data from the second location in NVM array 122, as compared to reading data from the first location in volatile memory array 118. In addition, repeatedly performing read operations at the second location in NVM array 122 does not reduce the usable life of the second location to the same degree, as compared to a write operation at the second location. Write operations generally have a much greater effect on the life expectancy of the second location, as compared to performing write operations at the first location in volatile memory array 118.

MD 106 also includes NVM 120, which in some implementations, can include a reserved portion of NVM array 122 for non-volatilely storing persistency data structure 14, MD firmware 16, and checkpoint data structure 20 across power cycles of MD 106. Persistency data structure 14 can indicate whether the data stored for a particular address or group of addresses is considered persistent. In some implementations, persistency data structure 14 can include a bitmap associating addresses with a binary value indicating whether data for the address is persistent. In addition, persistency data structure 14 may have different address granularities in different implementations. For example, some implementations may indicate whether a given byte address is considered persistent, while other implementations may indicate whether a group of contiguous byte addresses, such as for a memory page, is considered persistent. As used herein, the term address is understood to pertain to either a single address or a group of contiguous addresses.

In the example of FIG. 1, volatile memory 121 stores location data structure 18 to indicate a location of temporary data stored in MD 106. As noted above, temporary data can be designated for volatile storage by CPU 101, as opposed to persistent data designated for non-volatile storage by CPU 101. Location data structure 18 can include, for example, a bitmap associating addresses with a binary value to indicate whether temporary data has been flushed or copied from volatile memory array 118 to NVM array 122 since a last power-up or during a current power cycle of MD 106. As discussed in more detail below with reference to FIGS. 10 and 11, location data structure 18 can be checked for the location of temporary data for performing a read command for data indicated as not being persistent in persistency data structure 14.

Since location data structure 18 is stored in a volatile memory, it is erased or reset to an initial state after MD 106 powers off to initially indicate that all temporary data is to be retrieved from volatile memory array 118. Location data structure 18 is then ready to keep track of which addresses have temporary data flushed from the first location during a current power cycle of MD 106. After writing new temporary data to volatile memory array 118, an indication in location data structure 18 may be reset to its initial state to indicate that temporary data for the address is again located in volatile memory array 118. In other implementations, location data structure 18 can be stored in an NVM, such as NVM 120, and erased or reset during an initialization process after MD 106 powers-up. In yet other implementations, location data structure 18 may be stored in volatile memory array 118, so that it is erased or cleared after MD 106 is powered off.

Checkpoint data structure 20 can indicate whether checkpointed data has been stored in NVM array 122 for different addresses. As discussed in more detail below, checkpoint data structure 20 may be used to determine whether to return data from NVM array 122 in performing a command to obtain checkpointed data. Checkpoint data structure 20 can include, for example, a bitmap associating addresses with a binary value to indicate whether data has been checkpointed for the address. As with persistency data structure 14, checkpoint data structure 20 is maintained across power cycles of MD 106.

As shown in the example of FIG. 1, CAM 123 includes transaction table 22 to indicate whether data for a particular address or addresses are currently being modified in volatile memory array 118 as part of a transaction. CAM 123 can include, for example, a computer memory for high speed searching, such as an associative memory or array. As discussed in more detail below with reference to FIG. 14, transaction table 22 can include, for example, addresses that are currently being modified in volatile memory array 118 as part of a transaction that has not completed yet. Transaction table 22 is shown as being stored in CAM 123 in FIG. 1, but in other implementations, transaction table 22 may be stored in a different memory location, such as a in NVM 120 or in volatile memory 121.

In the example of FIG. 1, NVM 120 also stores MD firmware 16 that can include computer-executable instructions for operating MD 106. Controller 112 accesses MD firmware 16 or portions of MD firmware 16 for execution when performing data access operations.

Figure 2A:
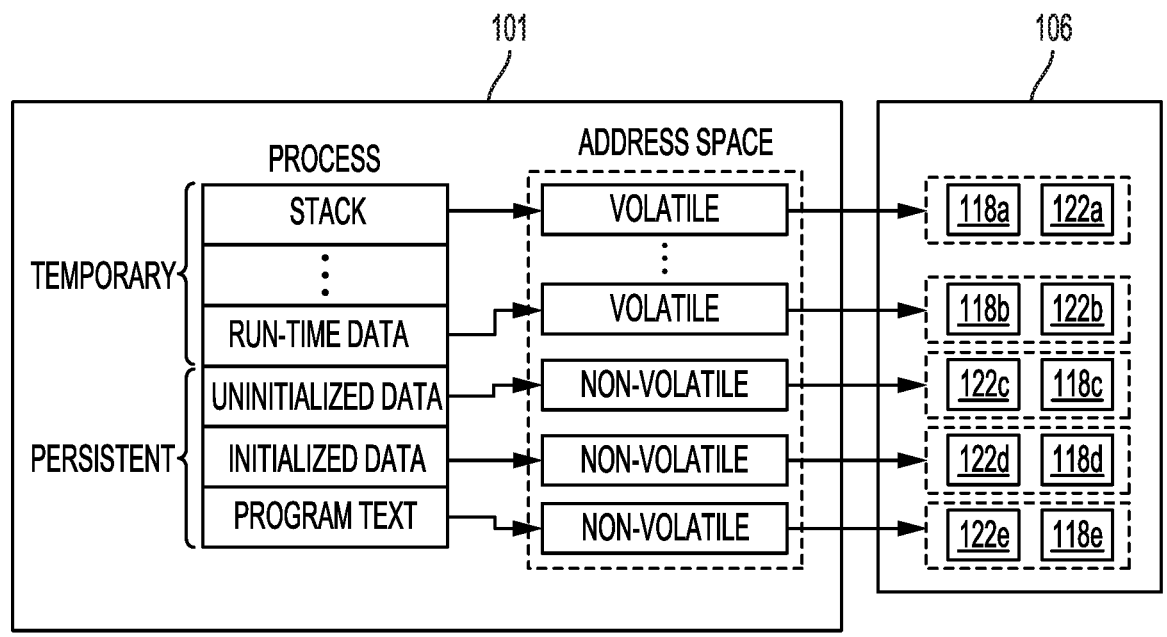
FIG. 2A illustrates the access of memory pages by a process or a thread that designates the memory pages as volatile or non-volatile according to an embodiment.

FIG. 2A illustrates the allocation of memory pages for a process or a thread executed by control circuitry 102 that designates the memory pages as volatile or non-volatile according to an embodiment. The process or thread can be run as part of an application, such as an Operating System (OS), or other user-space application. The OS allocates virtual addresses to be used by the process when executing functions for the process or thread. In allocating the virtual addresses, the OS creates a virtual address space including memory pages that are byte addressable. As will be appreciated by those of ordinary skill in the art, a task scheduler of the OS may allow control circuitry 102 to concurrently execute multiple processes each with their own process stack by distributing time slices or quanta among the processes. In addition, multi-core implementations of CPU 101 may include multiple processing units for parallel processing.

As shown in FIG. 2A, the process designates data for volatile or non-volatile storage. The designation may be accomplished, for example, by marking memory pages for the data with certain flags that can be used by an OS to designate the memory pages to be stored as volatile or non-volatile data. Although conventional systems typically use a volatile memory such as a DRAM for temporarily storing data, the present disclosure allows CPU 101 to access MD 106 more directly without an intermediate volatile memory between MD 106 and CPU 101 by maintaining a designation between data that is considered by the processes executed by control circuitry 102 as temporary, and data that is considered persistent. This ordinarily allows for the use of volatile memory array 118 and NVM array 122 in place of a DRAM, or other main memory, without significantly altering the configuration or operation of control circuitry 102.

In addition, the arrangement of volatile memory array 118 and NVM array 122 in the present disclosure can ordinarily reduce the refresh rate for the first location in volatile memory array 118 after flushing data to the second location in NVM array 122, thereby reducing the power consumption of the system as compared to a conventional system using DRAM for its main memory. The volatility management discussed below provides a more compact, cost effective, and efficient memory management system than conventional memory management systems since MD 106 stores data considered by CPU 101 as persistent and designated for non-volatile storage (e.g., data generated as a result of an algorithm), in addition to data that is considered by CPU 101 as temporary (e.g., run-time data) and designated for volatile storage.

In the example of FIG. 2A, data that is considered temporary includes run-time data, such as local variables that are modified during execution of a function, and data that is considered persistent includes uninitialized and initialized data, and program text that may be accessed from NVM, such as from files stored in MD 106 or from another NVM. In some cases, the program text loaded from another NVM, such as from an external storage device, may be retained as persistent data in MD 106 for reuse of the program text from a location closer to CPU 101. Although the example of FIG. 2A shows the program text as persistent data, other examples may include program text identified as temporary data by the process, such as, for example, certain dynamic libraries loaded during execution of the process after creation of the process.

Figure 2B:
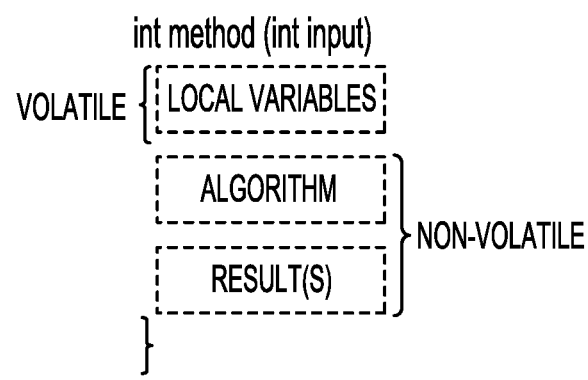
FIG. 2B provides an example of temporary and persistent data that may be used with a function performed by the process or thread of FIG. 2A.

FIG. 2B provides an example of a function that uses data designated for volatile storage (i.e., temporary data) and data designated for non-volatile storage (i.e., persistent data) by the process of FIG. 2A. The example "method" function in FIG. 2B includes one or more integer input variables, "int input", that are designated for volatile storage as local variables in the run-time data of the process stack. As appreciated by those of ordinary skill in the art, other examples may include different data types as inputs or variables. The function of FIG. 2B also includes an algorithm or code for the function, and after execution, returns one or more results. As shown in FIG. 2B, the process can identify the local variables as temporary run-time data designated for volatile storage, and identify the algorithm and certain results as persistent data designated for non-volatile storage. In some cases, other results may be returned to the stack as temporary data designated for volatile storage, such as when the results are intermediary results to be further modified by the process. The process or thread in FIG. 2A may also more randomly access other data from MD 106, such as an input value, using a heap memory structure, rather than the memory stack structure as described above.

In FIG. 2A, the process or thread executed by control circuitry 102 may request the allocation of non-volatile memory pages in the address space for data that is considered persistent or non-volatilely stored, such as certain results returned by the function. The process or thread may also request the allocation of volatile memory pages for other data that is considered temporary or volatilely stored, such as for run-time data. In this regard, the process or thread executing the function and designating whether the memory pages are considered volatile or non-volatile has intrinsic knowledge about the temporary or persistent state of the data allocated to the memory pages. In one example, a compiler executed by control circuitry 102 may designate memory pages as volatile or non-volatile for process or thread execution. As the process or thread executes the function, temporary run-time data, such as one or more local variables or intermediate results, is generated and designated for volatile memory pages by the process or thread in the virtual address space. The process or thread in the present disclosure can designate whether the memory pages are allocated to temporary or persistent data using, for example, a volatility flag or a special instruction that can be used by CPU 101 when forming a command to be sent to MD 106.

As discussed in more detail below, CPU 101 sends read and write commands to MD 106 to access the data for the allocated memory pages in MD 106. CPU 101 can define a volatility mode of operation for MD 106 based on whether a memory page in MD 106 is designated as volatile or non-volatile, and then set the defined volatility mode of operation for MD 106 by sending a separate volatility mode command to MD 106, or by including an indication of the volatility mode with a write command.

Figure 3:
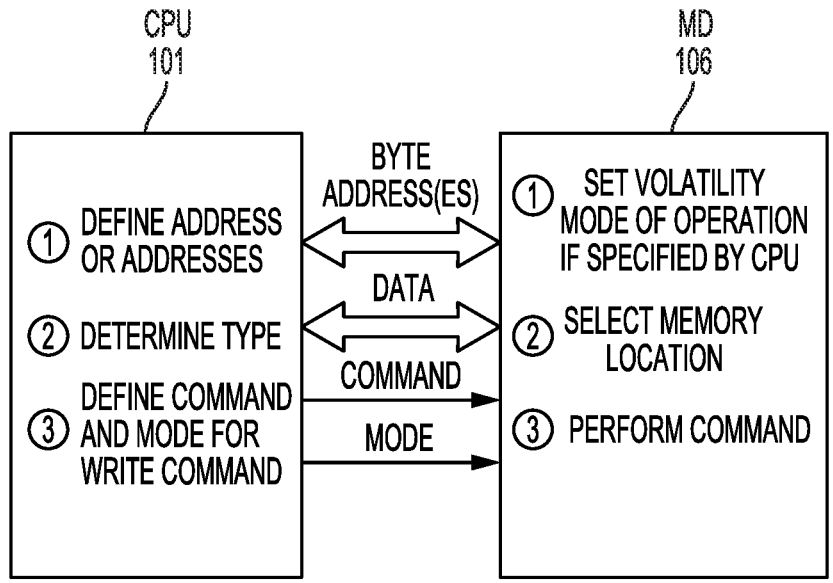
FIG. 3 illustrates communication between CPU and an MD in reading and writing data according to an embodiment.

FIG. 3 illustrates communication between CPU 101 and MD 106 for reading data from MD 106 and writing data to MD 106 according to an embodiment. Instructions executed by control circuitry 102 of CPU 101 define virtual addresses for data. When writing data, CPU 101 can further determine a volatility type for the data, which can include determining whether the data to be stored for the virtual addresses is considered temporary or persistent by a process or thread executed by control circuitry 102. MMU 104 of CPU 101 converts the virtual addresses to define physical byte addresses for the data, and may use flags or another indicator set by the process or thread for each memory page indicating whether the memory page for data to be written has been designated as a volatile or non-volatile memory page.

CPU 101 also defines the type of command, such as whether the data associated with the address or addresses is to be copied from MD 106 to CPU 101 (e.g., into L1/L2/L3 caches and registers of CPU 101) with a command to read data, or copied from CPU 101 to MD 106 with a command to write data. For commands to write data, the command can include, for example, a store command, a move command (e.g., mov command) to move data from CPU 101 to MD 106, or another write command type. The write command can include the data to be stored in MD 106, and the associated byte address or addresses for storing the data. For a command to read data, the command can include, for example, a move command (e.g., mov command) to move data from MD 106 to CPU 101 or another read command type, and the associated byte address or addresses for retrieving the requested data.

In some implementations, CPU 101 can include a flag or other indication, such as a special type of write command, for setting a volatility mode for the command based on whether the data for the command is allocated to a memory page or memory pages that have been designated as volatile or non-volatile. In other implementations, the volatility mode may be sent separately from the write command, or may be provided with a first write command to set the volatility mode for the first command and one or more commands following the first command.

MD 106 receives the commands from CPU 101 via bus 108, and controller 112 accesses volatile memory array 118 and/or NVM array 122 based on volatility mode 12 set in register 114 for write commands, and based on persistency data structure 14 for read commands. The determination of whether to access volatile memory array 118 and/or NVM array 122 may not be visible or otherwise apparent to CPU 101, since this determination and the resulting access of volatile memory array 118 and/or NVM array 122 is handled by controller 112.

In the case where CPU 101 sends a setting for the volatility mode, controller 112 can set a value in register 114 for volatility mode 12 corresponding to one of a volatile mode, a persistent mode, or a checkpoint mode. After starting up or when initializing MD 106, controller 112 can initially set a null mode by executing MD firmware 16, so that data is retrieved based on an indication in persistency data structure 14 before CPU 101 sets the volatility mode for MD 106. In some implementations, all read and write operations can be directed to volatile memory array 118 as a default if a volatility mode is not set. Example operations for different volatility modes are discussed in more detail below with reference to FIGS. 5 to 14. In addition, some systems may include other devices or components other than CPU 101, such as another CPU or processor, that similarly access MD 106 and can set a volatility mode for MD 106.

As shown in FIG. 3, the volatility mode of operation is set in register 114 if it is specified by CPU 101, and controller 112 selects one or more memory locations in volatile memory array 118 and/or NVM array 122 for accessing the data. In some implementations, each address has a first memory location in volatile memory array 118, and a second memory location in NVM array 122 corresponding to data for the same address. Persistency data structure 14 can include the addresses and an indication of whether the data for each address is considered persistent in MD 106. In other implementations, persistency data structure 14 can use indexes instead of addresses, since persistency data structure 14 can serve as a static bit map based on the capacity of one of the arrays. The index in persistency data structure 14 for an address can then be calculated from the address.

Unlike volatility mode 12 and transaction table 22, which may or may not be stored in a volatile memory such as an SRAM, persistency data structure 14 and checkpoint data structure 20 are stored in an NVM to persist across power cycles of MD 106. In the example of FIG. 1, persistency data structure 14 and checkpoint data structure 20 are stored in NVM 120, which is a reserved area of MD 106. Other implementations may store persistency data structure 14 or checkpoint data structure 20 in a different NVM of MD 106.

After determining the memory location or locations for performing the command, controller 112 performs the command by reading or writing data at the determined memory location or locations. A confirmation of the performance of a write command, or the data requested by a read command, can also be sent back to CPU 101 via bus 108.

The association of an address in both a volatile memory array and an NVM array of MD 106, together with the setting of a volatility mode of operation for MD 106, ordinarily allows for a more efficient and cost-effective memory architecture. In this regard, the use of MD 106 to store data considered temporary can replace one or more volatile intermediate memories (e.g., DRAM) to decrease the number of levels or layers of volatile memory typically found in current memory management systems.

MD Access Examples

Figure 4:
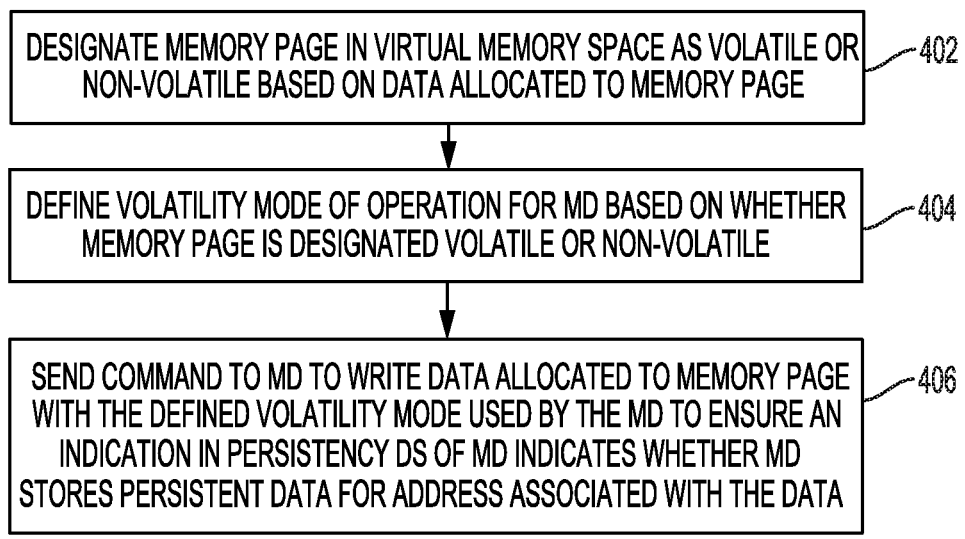
FIG. 4 is a flowchart for a data write process of a CPU according to an embodiment.

FIG. 4 is a flowchart for a data write process that can be executed by CPU 101 according to an embodiment. In block 402, control circuitry 102 of CPU 101 designates a memory page in a virtual memory space as volatile or non-volatile based on the data allocated to the memory page. As discussed above with reference to FIGS. 2A and 2B, a process or thread of an application executed by control circuitry 102 can determine whether data allocated to the memory page is considered temporary data, such as local variables or other run-time data that should be considered erased after deallocation or overwriting of the memory page. The process or thread can alternatively or additionally determine whether the data allocated to the memory page is considered persistent data, such as results from a function that should be kept persistent after the memory page is deallocated or overwritten. As discussed above, the designation of whether a memory page is volatile or non-volatile can be made using a flag or other indication such as a special instruction that can be used by CPU 101 in forming a command for MD 106.

In block 404, CPU 101 defines a volatility mode of operation for MD 106 based on whether the memory page or pages for the data are designated as volatile or non-volatile. CPU 101 may also send a volatility mode setting to MD 106 in block 404 or may send the volatility mode setting with a write command sent in block 406.

In block 406, CPU 101 sends a write command to MD 106 to write data in MD 106 that is allocated to the memory page or memory pages. The command may include, for example, a store command or a move command to copy data from CPU 101 to MD 106, a command to copy data from an address in MD 106 to another address in MD 106, a command to modify or store temporary data allocated to a volatile memory page, or a command to modify or store persistent data allocated to a non-volatile memory page. As noted above, the command can include a command type and an address or addresses for the data. In some cases, the address may include a range of addresses, such as a starting address and an extent or length for the data to be accessed, or an ending address.

As noted above, the volatility mode setting for MD 106 may also be included with the command sent in block 406. In some implementations, CPU 101 may provide a single volatility mode setting in a first command sent to MD 106 for one or more commands that are sent to MD 106 after the first command. In this regard, the setting of a volatility mode may precede or be concurrent with the sending of a command in block 406 in some cases.

Figure 5:
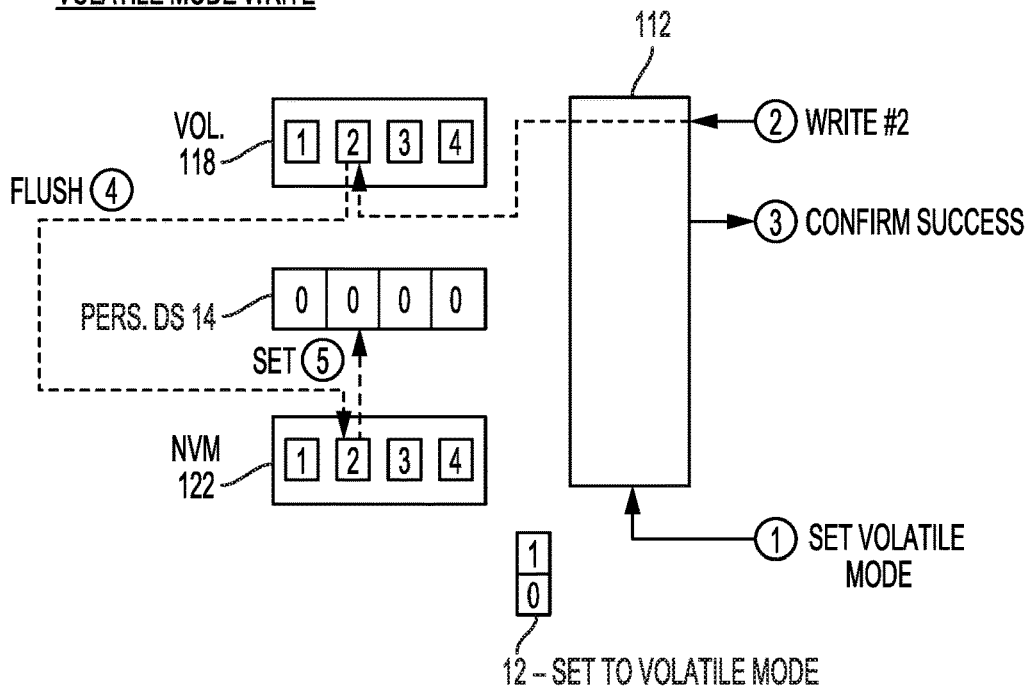
FIG. 5 illustrates an example write operation during a volatile mode of an MD according to an embodiment.

FIG. 5 depicts an example write operation during a volatile mode of operation according to an embodiment. In the example of FIG. 5, CPU 101 sets the volatility mode for MD 106 to the volatile mode. CPU 101 sends a write command for address #2 while MD 106 is in the volatile mode or may set the volatility mode with the write command for address #2. The data for the command is written to address #2 in the first location for address #2 in volatile memory array 118. A confirmation of the success of the write command may then be returned to CPU 101. Some implementations may not include a confirmation sent back to CPU 101, or may send an error back to CPU 101 indicating that the data was not written successfully if the data is not able to be written in volatile memory array 118. The data is then internally flushed or copied by controller 112 from the first location in volatile memory array 118 to the second location for address #2 in NVM array 122. The status indicated in location data structure 18 for address #2 is updated to indicate that NVM array 122 stores temporary data for address #2 as a result of flushing the data. The status indicated in persistency data structure 14 is also ensured to indicate that the data stored for address #2 is not persistent. In some cases, this includes changing or setting a value in persistency data structure 14 to a different value, such as from a "1" to a "0" as in the example of FIG. 5.

In some implementations, the order of writing data, ensuring the persistency status in persistency data structure 14 for the address, or confirming the success of the write command back to CPU 101 may be different than in the example of FIG. 5. For example, some implementations may first ensure the status in persistency data structure 14 and then confirm the success of the write command, or may write the data and ensure the status at the same time.

In addition, CPU 101 in some implementations may be able to send a special write command to MD 106 indicating that a particular write command should be performed as a volatile write command or a persistent write command, regardless of the volatility mode set for MD 106. For example, CPU 101 may send a special "write volatile" command so that data is only written to the first memory location in volatile memory array 118 as in the volatile mode, even if the volatility mode is currently set differently for MD 106. Controller 112 would then ensure that the persistency status for the written address in persistency data structure 14 indicates that the data for the address is not persistent. Similarly, CPU 101 may send a special "write persistent" command so that controller 112 ensures that the persistency status of the written address in persistency data structure 14 indicates that the data for the address is persistent.

Figure 6:
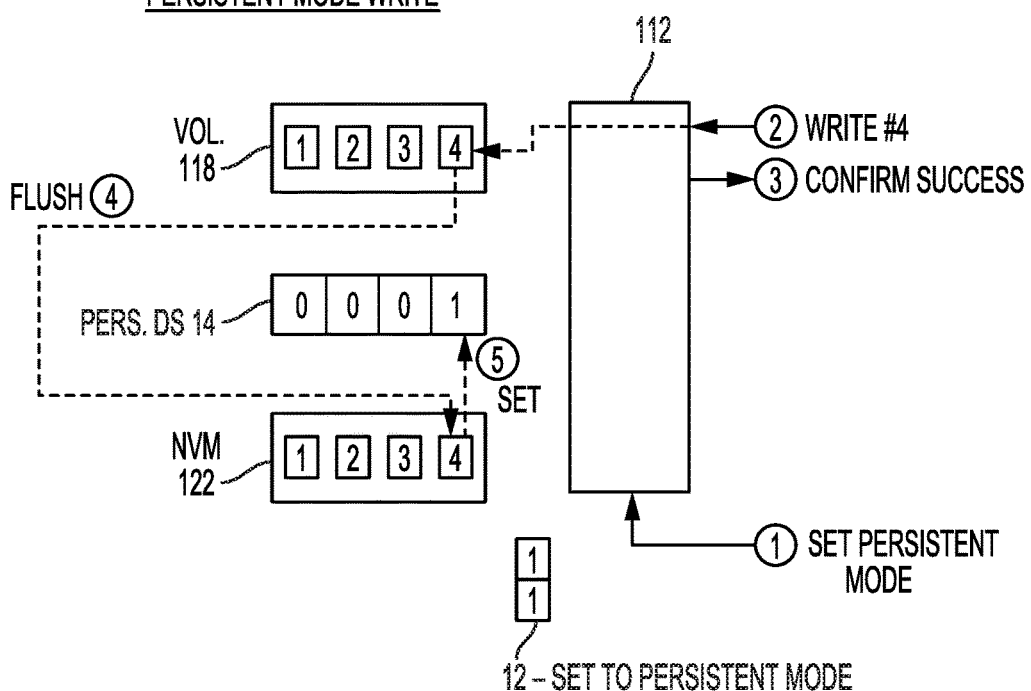
FIG. 6 depicts an example write operation during a persistent mode of an MD according to an embodiment.

FIG. 6 depicts an example write operation during the persistent mode according to an embodiment. In the example of FIG. 6, CPU 101 defines a type for a write command for address #4 as non-volatile. CPU 101 sends a command to set the volatility mode of operation for MD 106 to a persistent mode. CPU 101 then sends a write command for address #4 while MD 106 is in the persistent mode. As with the volatile mode example in FIG. 5, the data for the write command during the persistent mode in FIG. 6 is also written to the first location for address #4 in volatile memory array 118. The data is then flushed or copied to the second location for address #4 in NVM array 122. In other implementations, such as where NVM array 122 includes an SCM that can write data nearly as quickly as data is written to volatile memory array 118, the data written for the persistent mode may be written directly to NVM array 122 without writing the data first to volatile memory array 118.

Unlike the volatile mode example of FIG. 5, in the persistent mode of FIG. 6, the status for address #4 in persistency data structure 14 is ensured to indicate that the data for address #4 is considered persistent in MD 106. This may include maintaining an indication of persistency in persistency data structure 14, or changing an indicator for address #4 in persistency data structure 14. A confirmation of the success of the write command may be returned to CPU 101 after initially writing the data in volatile memory array 118. Some implementations may not include a confirmation sent back to CPU 101, or may send an error back to CPU 101 indicating that the data was not written successfully if the data is not able to be written to the first location in volatile memory array 118. In other implementations, CPU 101 may request a confirmation of the successful storage of the data to persistent memory. In such implementations, a confirmation may be sent after the data is successfully flushed from volatile memory array 118 to NVM array 122.

In some implementations, the order of writing data, ensuring the status in persistency data structure 14 for the address, or confirming the success of the write command back to CPU 101 may be different than in the example of FIG. 6. For example, some implementations may first ensure the status in persistency data structure 14 and then confirm the success of the write command, or may write the data and ensure the status at the same time.

In addition, and as noted above, some implementations may allow CPU 101 to send a special command to MD 106 for a volatile write or a persistent write, regardless of a current volatility mode of MD 106. In such implementations, the current volatility mode may apply to subsequent received commands that are not sent as a special command.

Figure 7:
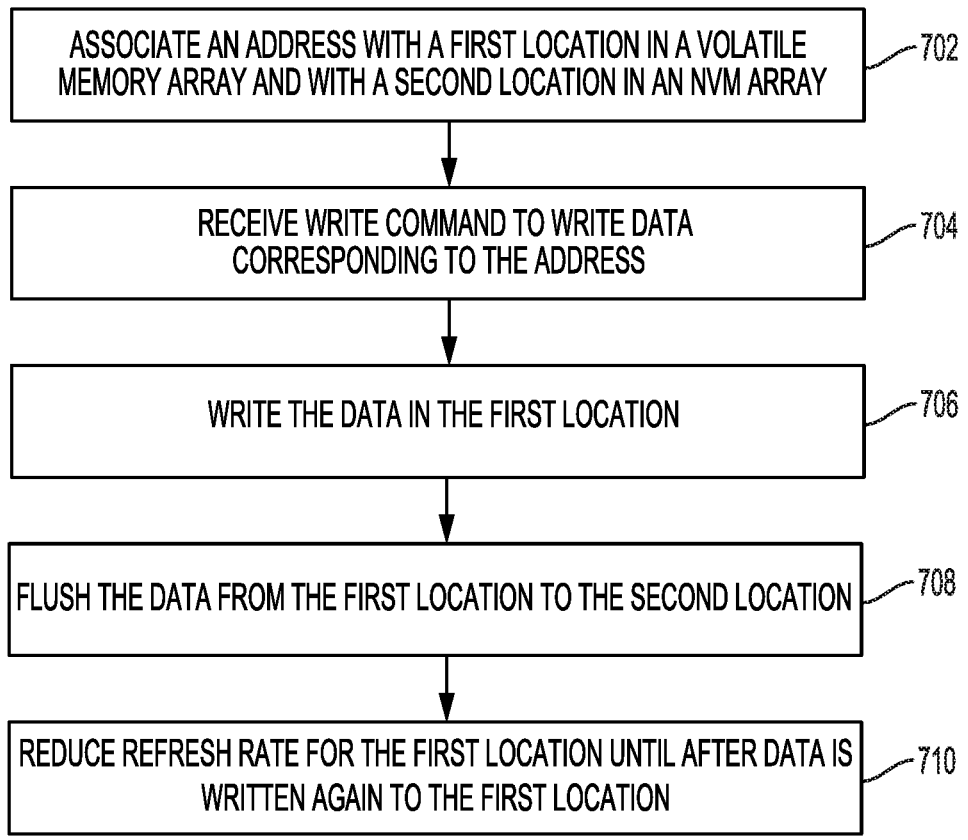
FIG. 7 is a flowchart for a data write process of an MD according to an embodiment.

FIG. 7 is a flowchart for a write process of an MD that can be performed by controller 112 executing MD firmware 16 according to an embodiment. In block 702, controller 112 associates an address for data with a first location in volatile memory array 118, and also associates the address with a second location in NVM array 122. The association may be performed as part of an initialization process of MD 106 before receiving any read or write commands from CPU 101. The association may be stored in an NVM of MD 106, such as in NVM 120. In other implementations, the association can be a mathematic relationship between the memory locations in volatile memory array 118 and NVM array 122. The calculation for associating the memory locations may be performed, for example, by specialized circuitry of controller 112. When CPU 101 boots-up or starts-up, CPU 101 may communicate with MD 106 to obtain a range or a plurality of addresses available for storing data in volatile memory array 118 and NVM array 122. Each address in the plurality of addresses can correspond to a first physical location in volatile memory array 118, and also correspond to a second physical location in NVM array 122.

In block 704, MD 106 receives a write command to write data for the address associated with the first location and the second location in block 702. As discussed above, the command may also include a setting for a volatility mode of operation for MD 106, such as a volatile mode, a persistent mode, or a checkpoint mode. In some cases, CPU 101 may not specify a volatility mode, such as when a previously set volatility mode is to be used for the write command received in block 704, when a separate command from CPU 101 sets the volatility mode, or when MD 106 is operating in a default mode or in the null mode.

In block 706, controller 112 writes the data to the first location in volatile memory array 118. Controller 112 may also optionally confirm the success of the write command back to CPU 101 after writing the data to the first location.

In block 708, controller 112 flushes the data from the first location in volatile memory array 118 to the second location for the address in NVM array 122. In addition, location data structure 18 is updated in block 708 to indicate that NVM array now stores temporary data for the address. After the data has been flushed or copied to the second location, the data is non-volatilely stored, even if the data is considered temporary data by CPU 101. This can allow for the reduction of power supplied to the first location in volatile memory array 118, which can reduce the power consumed by MD 106.

In block 710, controller 112 reduces a refresh rate for the first location. The refreshing of data in memory locations in volatile memory array 118 may be controlled by power circuitry of controller 112 that supplies power at a particular refresh rate to portions of volatile memory array 118. In an example where volatile memory array 118 includes eDRAM, the refresh rate may ordinarily be approximately every 40 microseconds in a conventional system. In contrast, the refresh rate may be decreased by multiple orders of magnitude or power may be completely removed so that less power is supplied to the first location until after data has again been written to the first location.

Figure 8:
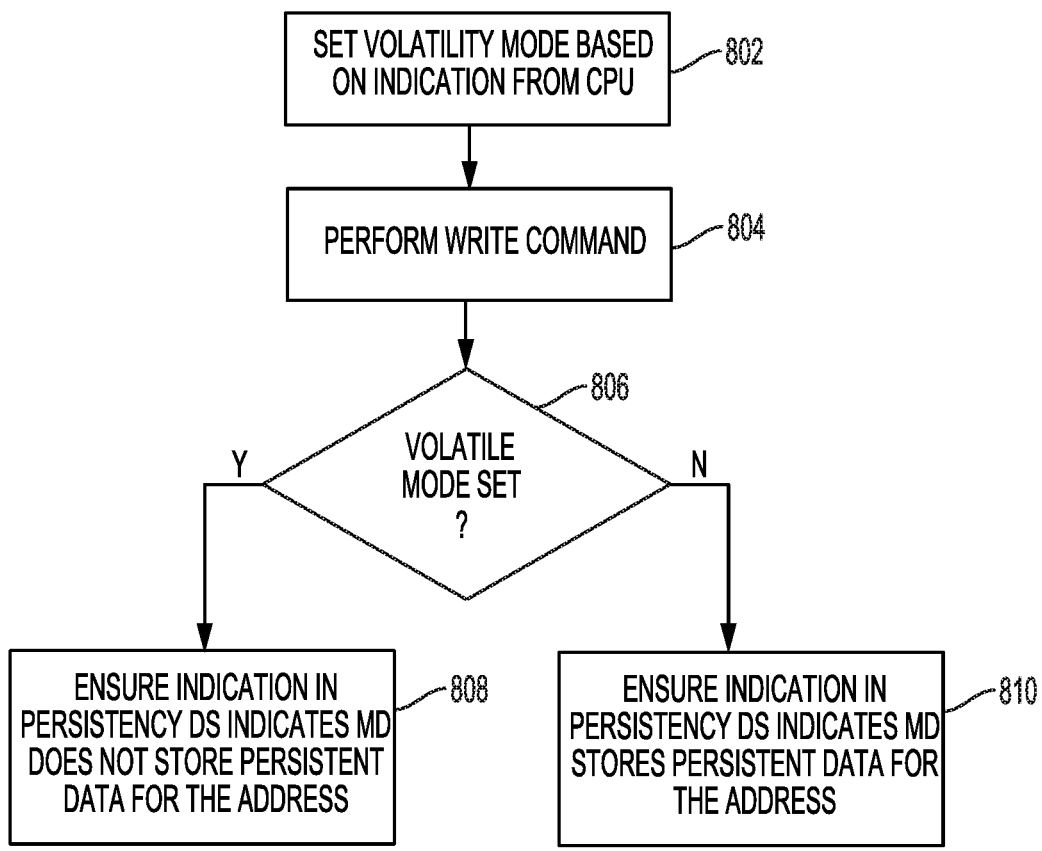
FIG. 8 is a flowchart for a data write sub-process of an MD according to an embodiment.

FIG. 8 is a flowchart for a data write sub-process that can be performed by controller 112 executing MD firmware 16 according to an embodiment. The sub-process of FIG. 8 may be performed, for example, as part of a write process for a MD, such as after receiving a command to write data in MD 106, as in block 704 of FIG. 7.

In block 802, a volatility mode is set for MD 106, such as in response to a command received from CPU 101 indicating a particular volatility mode for MD 106. The command to set the volatility mode may be received, for example, with a write command or as a separate command from CPU 101.

In this regard, a write command is performed in block 804 by writing data to a first location in volatile memory array 118. In block 806, it is determined whether the volatility mode for MD 106 is set to a volatile mode. If so, controller 112 ensures in block 806 that persistency data structure 14 indicates that MD 106 does not store persistent data for the address for the write command performed in block 804. Ensuring that persistency data structure 14 indicates that data is not persistent for the address can include setting a value (e.g., a binary value) indicating that data for the address is not persistent or checking whether a current value in persistency data structure 14 for the address indicates that data for the address is considered temporary or not persistent. The data written during the volatile mode may later be flushed from a first location in volatile memory array 118 to a second location in NVM array 122 so that power can be reduced at the first location. Location data structure 18 is then updated to reflect that the second location stores temporary data.

On the other hand, if it is determined in block 806 that the volatility mode for MD 106 is not set to the volatile mode, such as when the volatility mode is set to a persistent mode, controller 112 ensures in block 808 that persistency data structure 14 indicates that MD 106 stores persistent data for the address or addresses for the write command performed in block 804. Ensuring that persistency data structure 14 indicates persistent data for the address can include setting a value (e.g., a binary value) indicating persistent data or checking whether a current value in persistency data structure 14 for the address indicates that the data is considered persistent. The data written outside of the volatile mode is then flushed from the first location in volatile memory array 118 to the second location in NVM array 122.

Figure 9:
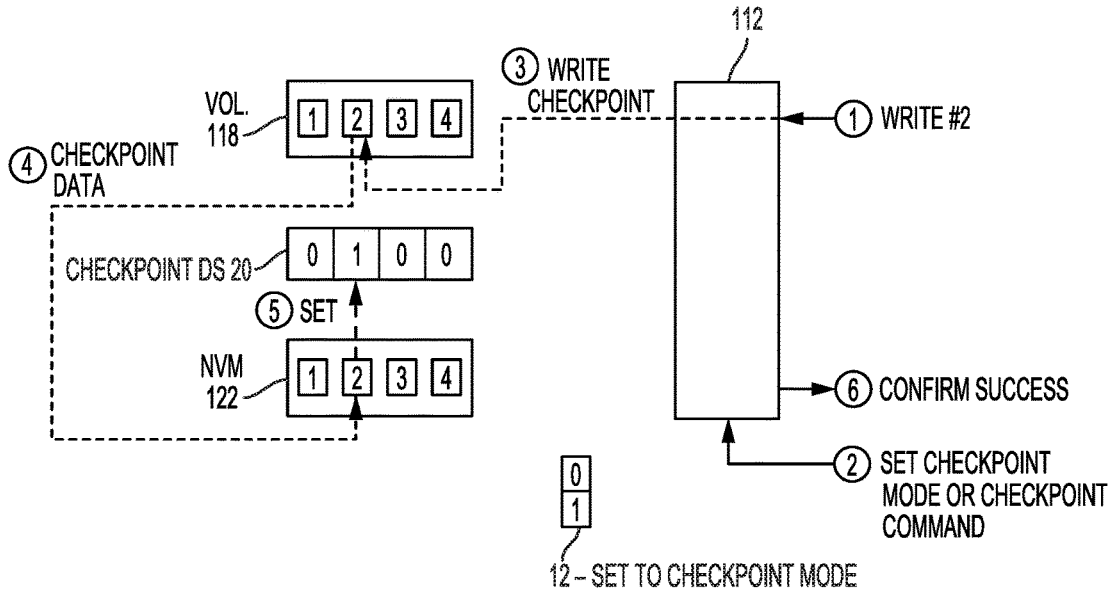
FIG. 9 depicts an example checkpoint write operation according to an embodiment.

FIG. 9 depicts an example write operation to volatile memory array 118, and the checkpointing or copying of the written data to NVM array 122 according to an embodiment. In the example of FIG. 9, a write command for address #2 is received when MD 106 is set to the volatile mode. MD 106 writes the data for the write command to the first location for address #2 in volatile memory array 118.

CPU 101 then sets the volatility mode for MD 106 to a checkpoint mode or sends a checkpoint command to checkpoint or copy the data written in the first location for address #2 to the second location for address #2 in NVM array 122. In some cases, the checkpointed data stored in NVM array 122 may include a timestamp or other indication of when the data was checkpointed to NVM array 122. In other implementations, NVM array 122 may only store a single checkpoint for a previous state of the data without a timestamp or indication of when the data was checkpointed. As discussed in more detail below with respect to FIGS. 14 and 15, the checkpointed data stored in NVM array 122 can allow data for the address to be modified in volatile memory array 118, while retaining the earlier checkpointed data in the second location in NVM 122. Such checkpointed data can be used, for example, to recover the earlier state of the data in the event of an error or other need to roll-back the data to its earlier state.

In the example of FIG. 9, the status for address #2 in checkpoint data structure 20 is then ensured to indicate that the data for address #2 is considered checkpoint data in NVM array 122. This may include maintaining an indication in checkpoint data structure 20, or setting a different value of an indicator for address #2 in checkpoint data structure 20. A confirmation of the success of the checkpointing may then returned to CPU 101. Some implementations may not include a confirmation sent back to CPU 101, or may send an error back to CPU 101 indicating that the data was not successfully checkpointed if the data is not able to be checkpointed or copied to the second location in NVM array 122.

In some implementations, the order of checkpointing or copying the data, ensuring the status in checkpoint data structure 20 for the address, or confirming the success of the checkpoint back to CPU 101 may be different than in the example of FIG. 9. For example, some implementations may first confirm the success of the checkpointing and then ensure the status in checkpoint data structure 20, or may checkpoint the data and ensure the status at the same time.

Figure 10:
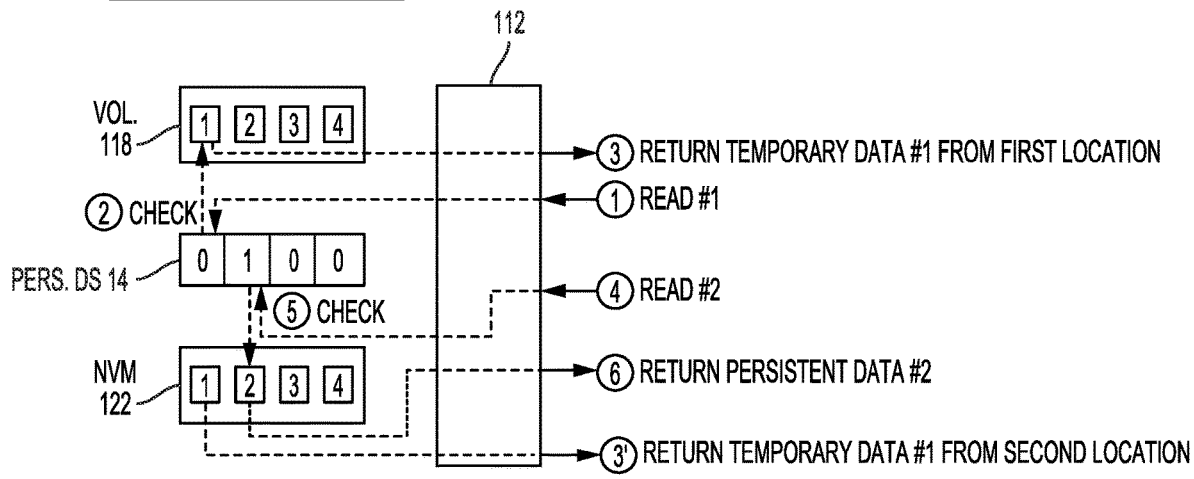
FIG. 10 depicts an example read operations using a persistency data structure according to an embodiment.

FIG. 10 depicts example read operations in MD 106 using persistency data structure 14 according to an embodiment. As discussed above, controller 112 may initially set the volatility mode for MD 106 to a null or default mode after MD 106 powers-up, such as a volatile mode where data is written to volatile memory array 118 and may not be flushed to NVM array 122 until a different volatility mode is set. In other implementations the default or null mode may be the volatile mode as described above for FIG. 5 where data is flushed to NVM array 122 after being written in volatile memory array 118, and persistency data structure 14 is ensured to indicate that the data for the address is not persistent.

In the example of FIG. 10, a read command is received for address #1 when volatility mode 12 in register 114 is set to a volatile mode or a persistent mode. Address #1 is checked in persistency data structure 14 to determine if the data stored in NVM array 122 for address #1 is considered persistent. Since persistency data structure 14 for address #1 indicates that the data for address #1 in NVM array 122 is not considered persistent (i.e., a value of "0"), it is determined whether the temporary data for address #1 has been flushed from the first location in volatile memory 118 to the second location in NVM array 122 since a last power-up of MD 106 by checking location data structure 18. If it is indicated that the temporary data has not been flushed to the first location, the data stored in the first location in volatile memory array 118 is returned to CPU 101. On the other hand, if it is indicated in location data structure 18 that the temporary data has been flushed to the second location since a last power-up, the data stored in the second location in NVM array 122 is returned to CPU 101.

In contrast, a read command is received for address #2, and persistency data structure 14 is checked for the persistency status of the data stored for address #2. Since persistency data structure 14 indicates that the data for address #2 is considered persistent, the second location for address #2 is read in NVM array 122, and MD 106 returns the data read from the second memory location to CPU 101.

In cases where the volatility mode is set to a checkpoint mode, all read commands can be performed by returning data from volatile memory array 118, except for when a special command is received to retrieve checkpointed data, such as with the "get checkpoint" command described in more detail below with reference to FIG. 12. Read commands received during the checkpoint mode may not require checking persistency data structure 14, since data will be returned from the first location in volatile memory array 118.

Figure 11:
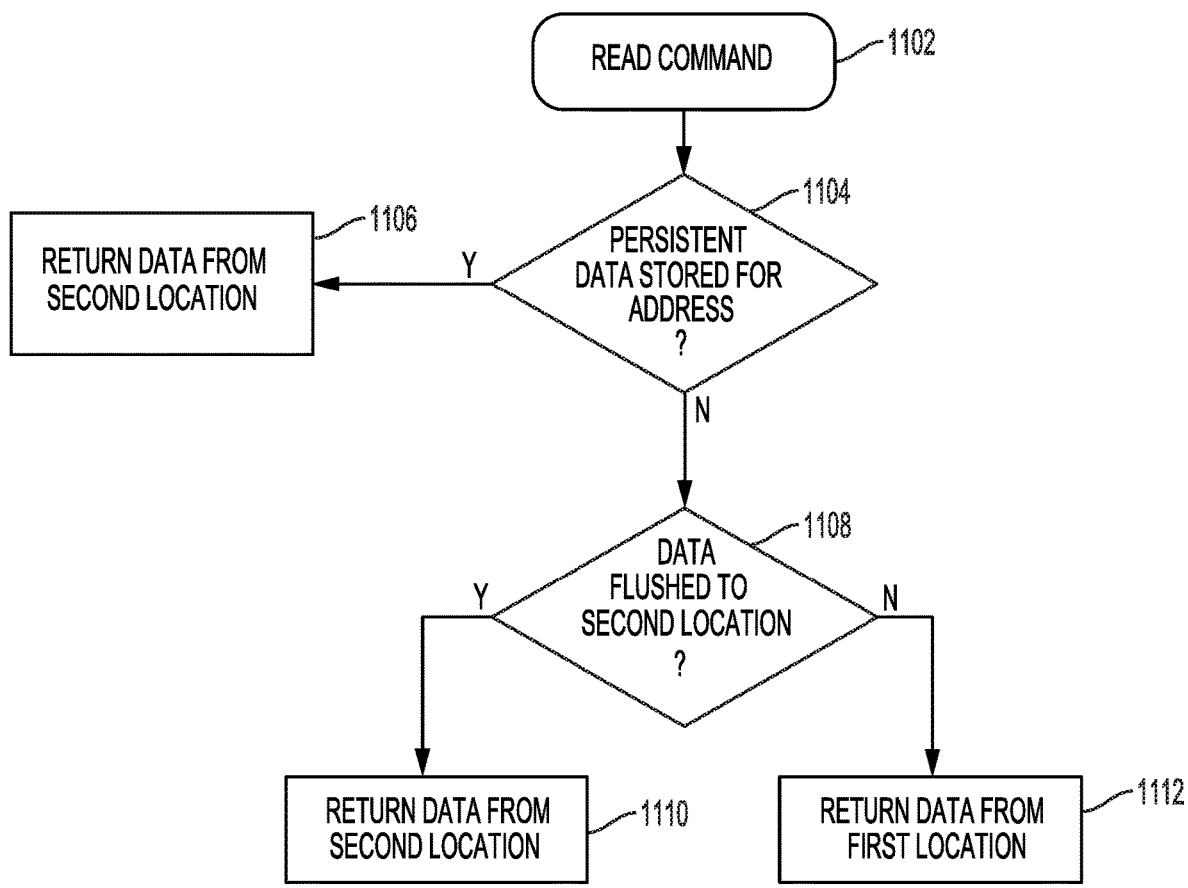
FIG. 11 is a flowchart for a read process of an MD according to an embodiment.

FIG. 11 is a flowchart for a read process of MD 106 according to an embodiment. In some implementations, the read process of FIG. 11 can be performed by controller 112 executing MD firmware 16.

In block 1102, a read command is received for an address. In block 1104, it is determined whether MD 106 stores persistent data for the address using persistency data structure 14.

If it is determined that the data stored in MD 106 for the address is persistent, controller 112 in block 1106 returns the data stored in the second location in NVM array 122. On the other hand, if MD 106 does not store persistent data for the address, controller 112 in block 1108 determines whether the temporary data for the read command has been previously flushed or copied to the second location in NVM array 122 since a last power-up of MD 106 using location data structure 18. If so, controller 112 in block 1110 returns temporary data from the second location.

If it is determined in block 1108 that the temporary data for the read command has not been previously flushed to the second location in NVM array 122, controller 112 in block 1112 returns the data stored in the first location in volatile memory array 118.

As noted above, flushing or copying temporary data from the first location in volatile memory array 118 to the second location in NVM array 122 can ordinarily reduce the overall amount of power used for the first location by reducing the refresh rate for the first location. The use of location data structure 18 allows for the temporary data to be read from the second location in NVM array 122 while reducing power consumption by volatile memory array 118.

Figure 12:
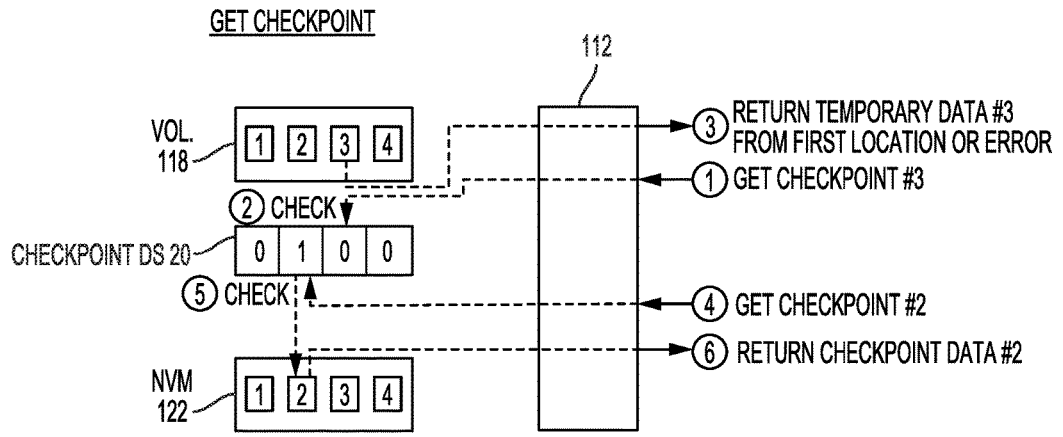
FIG. 12 depicts example get checkpoint operations according to an embodiment.

FIG. 12 depicts example "get checkpoint" operations according to an embodiment to obtain checkpointed data. In the example of FIG. 12, a get checkpoint command to retrieve checkpointed data for address #2 is received from CPU 101. Controller 112 accesses checkpoint data structure 20 to determine whether the data for address #2 in NVM array 122 is checkpointed data. Since checkpoint data structure 20 indicates that the data for address #2 is checkpointed in NVM array 122 (i.e., a value of "1" for address #2), the data from the second location in NVM array 122 is returned to CPU 101 to complete the get checkpoint command.

In contrast, a get checkpoint command to retrieve a checkpoint for address #3 is received from CPU 101, but controller 112 determines that the data for address #3 is not checkpointed in NVM array 122 (i.e., a value of "0" for address #3). Controller 112 then returns the data from the first location in volatile memory array 118 to perform the get checkpoint command. In other implementations, controller 112 may instead return an error indication or zeroed data if checkpoint data structure indicates that NVM array 122 does not store checkpointed data for the address.

Figure 13:
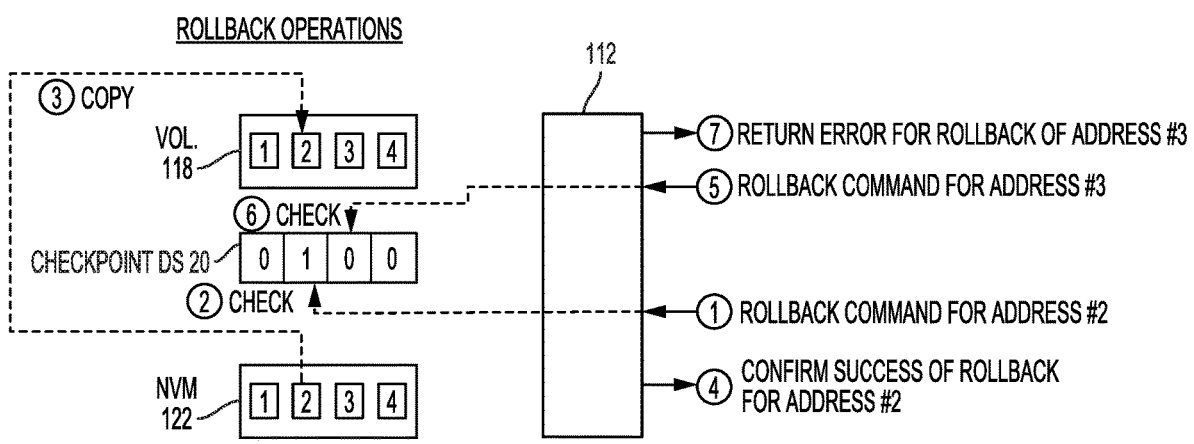
FIG. 13 depicts example rollback operations according to an embodiment.

FIG. 13 depicts example rollback operations that can be performed by controller 112 according to an embodiment. As discussed above, a rollback operation can allow checkpointed data for an address to be copied from the second location in NVM array 122 to the first location in volatile memory array 118. This can allow for the recovery or a return to an earlier state of the data for the address.

In the example of FIG. 13, a first rollback command is received from CPU 101 to copy data for address #2 to an earlier checkpointed state stored in the second location for address #2 in NVM array 122. After receiving the rollback command, controller 112 checks checkpoint data structure 20 for address #2 to determine whether the data stored in NVM array 122 for address #2 is checkpointed data. The checkpointed data in NVM array 122 can result from an earlier write checkpoint command, as described above with reference to FIG. 9.

Since checkpoint data structure 20 indicates that the data stored in the second location is checkpointed data for address #2, controller 112 then copies the data stored in the second location for address #2 to the first location in volatile memory array 118 for address #2.

In contrast, a rollback command is received in FIG. 13 for address #3, which is not indicated as having checkpointed data stored in NVM array 122. Controller 112 then returns an error to CPU 101 indicating that the rollback operation could not be performed.

Figure 14:
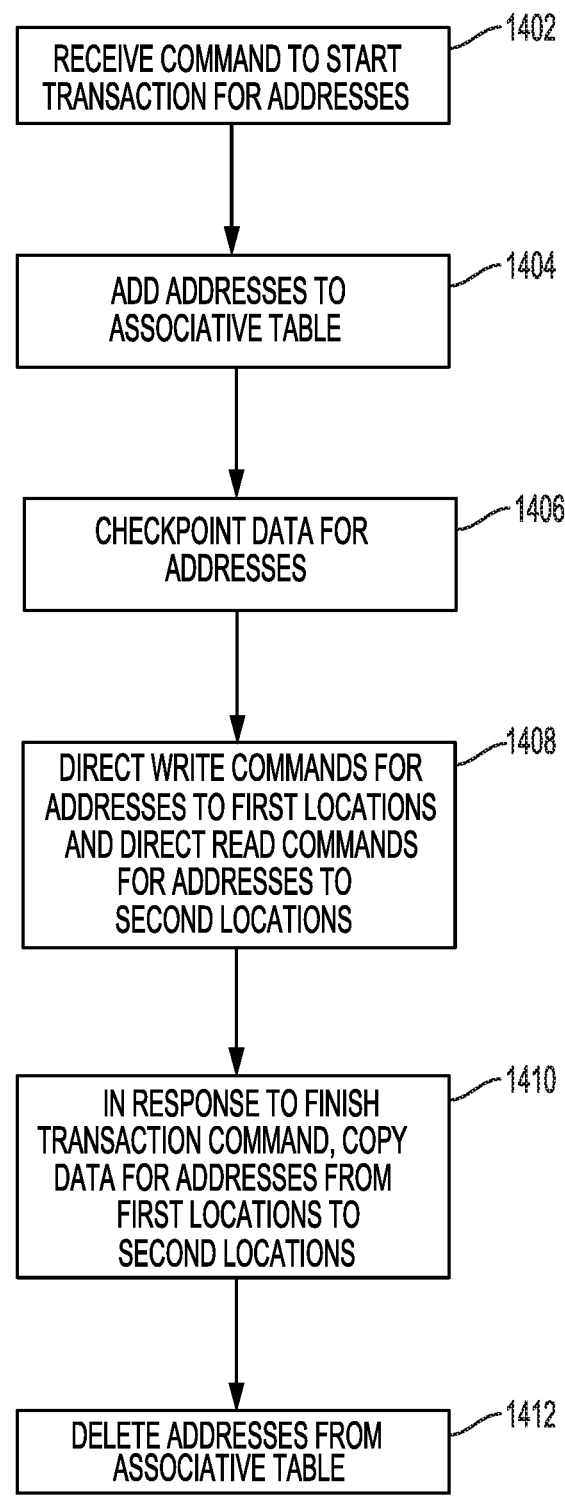
FIG. 14 is a flowchart for a transaction process of an MD according to an embodiment.

FIG. 14 is a flowchart for a transaction process that can be performed by controller 112 executing MD firmware 16 according to an embodiment. The transaction process of FIG. 14 may be performed on data stored in NVM array 122 that is considered persistent or on temporary data stored in volatile memory array 118 or NVM array 122 that is not considered persistent. The transaction process of FIG. 14 ordinarily allows for the modification of data for multiple addresses in volatile memory array 118 to successfully complete before data for the addresses is copied back to NVM array 122 as persistent data. As discussed below, checkpointed data for the addresses is retained in NVM array 122 during the transaction for rollback or for recovery of the data being modified in the event of an unsuccessful write operation in volatile memory array 118. In addition, the transaction process of FIG. 14 can allow for the use of the relatively fast access speeds of volatile memory array 118 to perform the modifications.

In block 1402, MD 106 receives a command from CPU 101 to start a transaction for a plurality of addresses. The start transaction command can indicate the addresses that will be modified as part of the transaction. In block 1404, controller 112 adds the addresses to transaction table 22 to identify the addresses being modified by the transaction.

In block 1406, data for the addresses to be modified is checkpointed in their respective second locations in NVM array 122. In some cases, location data structure 18 may indicate that the current version of the data is located in the first location in volatile memory array. In such cases, the data is checkpointed by copying the data to the second location in NVM array 122. In other cases, location data structure 18 may indicate that the current version of the data is already located in NVM array 122, such that data is not copied from the first location to the second location. In both cases, checkpoint data structure 20 is updated in block 1406 to ensure that checkpoint data structure 20 indicates that NVM array 122 stores checkpointed data for the addresses. The checkpointed data can then serve as a consistent state of the data for read commands during the transaction or for recovering data for the addresses if the transaction does not complete successfully.

In block 1408, controller 112 directs write commands received for the addresses added to transaction table 22 to their respective first locations in volatile memory array 118. On the other hand, controller 112 in block 1408 directs read commands for these addresses to their respective second locations in NVM array 122 during the transaction to provide checkpointed data for the addresses.

In block 1410, a command to finish the transaction is received from CPU 101. In response, controller 112 copies the data for the addresses from their first locations in volatile memory array 118 to their corresponding second locations in NVM array 122.

In block 1412, the addresses for the transaction are deleted from transaction table 22 and the transaction is considered complete. In some implementations, the power supplied to the first locations for the addresses in the transaction can be reduced following the transaction to conserve power.

As discussed above, the use of NVM array 122 to store data that would otherwise be retained in a volatile memory ordinarily reduces power by being able to reduce power supplied to locations in volatile memory array 118. The foregoing arrangements can also take advantage of a faster write speed of volatile memory array 118 by initially writing data to volatile memory array 118 and flushing the data to NVM array 122.

Other Embodiments

Those of ordinary skill in the art will appreciate that the various illustrative logical blocks, modules, and processes described in connection with the examples disclosed herein may be implemented as electronic hardware, computer software, or combinations of both. Furthermore, the foregoing processes can be embodied on a computer readable medium which causes a processor or a controller to perform or execute certain functions.

To clearly illustrate this interchangeability of hardware and software, various illustrative components, blocks, and modules have been described above generally in terms of their functionality. Whether such functionality is implemented as hardware or software depends upon the particular application and design constraints imposed on the overall system. Those of ordinary skill in the art may implement the described functionality in varying ways for each particular application, but such implementation decisions should not be interpreted as causing a departure from the scope of the present disclosure.

The various illustrative logical blocks, units, and modules described in connection with the examples disclosed herein may be implemented or performed with a processor or a controller, such as, for example, a CPU, an MPU, an MCU, or a DSP, and can include, for example, an FPGA, an ASIC, or other programmable logic device, discrete gate or transistor logic, discrete hardware components, or any combination thereof designed to perform the functions described herein. A processor or controller may also be implemented as a combination of computing devices, e.g., a combination of a DSP and an MPU, a plurality of MPUs, one or more MPUs in conjunction with a DSP core, or any other such configuration. In some implementations, the controller or processor may form at least part of an SoC.

The activities of a method or process described in connection with the examples disclosed herein may be embodied directly in hardware, in a software module executed by a processor or a controller, or in a combination of hardware and software. The steps of the method or algorithm may also be performed in an alternate order from those provided in the examples. A software module may reside in RAM memory, flash memory, ROM memory, EPROM memory, EEPROM memory, other types of solid state memory, registers, hard disk, removable media, optical media, or any other form of storage medium known in the art. An exemplary storage medium is coupled to a processor or a controller such that the processor or the controller can read information from, and write information to, the storage medium. In the alternative, the storage medium may be integral to the processor or the controller. The storage medium and the processor or controller may reside in an SoC.

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive.

What is claimed is:

1. A method of operating a Memory Device (MD) for storing temporary data designated for volatile storage by a processor and persistent data designated for non-volatile storage by the processor, the method comprising:
   associating an address with a first location in a volatile memory array of the MD and with a second location in a Non-Volatile Memory (NVM) array of the MD, wherein the address is a byte address or a page address;
   receiving a write command to write data in the MD for the address;
   writing the data in the first location;
   flushing the data from the first location to the second location; and
   reducing a refresh rate for the first location associated with the address as compared to other portions of the volatile memory array after flushing the data from the first location until after data is written again to the first location.

2. The method of claim 1, wherein the volatile memory array includes an embedded Dynamic Random Access Memory (eDRAM).

3. The method of claim 1, further comprising:
   setting a volatility mode of operation for the MD based on an indication from the processor;
   when the write command is performed while the volatility mode of operation is set to a volatile mode, ensuring that an indication in a persistency data structure stored in an NVM location of the MD indicates that the MD does not store persistent data for the address after performing the write command; and
   when the write command is performed while the volatility mode of operation is set to a persistent mode, ensuring that the indication in the persistency data structure indicates that the MD stores persistent data for the address after performing the write command.

4. The method of claim 3, further comprising:
   receiving a read command for the address;
   determining whether the MD stores persistent data for the address using the persistency data structure;
   in response to determining that the data stored in the MD for the address is not persistent, performing the read command by returning the data stored in the first location or in the second location based on whether the data has been flushed from the first location to the second location since a last power-up of the MD; and
   in response to determining that the data stored in the MD for the address is persistent, performing the read command by returning the data stored in the second location.

5. The method of claim 1, further comprising:
   receiving a get checkpoint command to retrieve checkpointed data for the address;
   determining whether data stored in the second location is checkpointed data;
   in response to determining that the data stored in the second location is checkpointed data, performing the get checkpoint command by returning the checkpointed data from the second location; and
   in response to determining that the data stored in the second location is not checkpointed data, performing the get checkpoint command by returning data stored in the first location.

6. The method of claim 1, further comprising:
   receiving a command to start a transaction for a plurality of addresses;
   checkpointing data for the plurality of addresses in the NVM array;
   directing write commands for the plurality of addresses to respective first locations in the volatile memory array during the transaction;
   directing read commands for the plurality of addresses to respective second locations in the NVM array during the transaction; and
   in response to receiving a command to finish the transaction, copying the data for the plurality of addresses from the first locations in the volatile memory array to the corresponding second locations in the NVM array.

7. A method for operating a processor, the method comprising:
   designating a memory page in a virtual memory space as volatile or non-volatile based on data allocated to the memory page;
   defining a volatility mode of operation for a Memory Device (MD) based on whether the memory page is designated as volatile or non-volatile; and
   sending a write command to the MD to write the data allocated to the memory page in the MD, wherein the defined volatility mode of operation is used by the MD to ensure that an indication in a persistency data structure stored in an NVM location of the MD indicates whether the MD stores persistent data for an address associated with the data after performing the write command, and
   wherein the MD is configured to associate the address with a first physical location in the volatile memory array and with a second physical location in the NVM array before receiving the write command.

8. The method of claim 7, further comprising setting the defined volatility mode of operation for the MD by sending a separate volatility mode command to the MD or by including an indication of the defined volatility mode with the command.

9. The method of claim 7, further comprising sending to the MD at least one of a checkpoint copy command to rollback data to an earlier state and a get checkpoint command to retrieve checkpointed data from the MD.

10. The method of claim 7, wherein the processor forms part of a System on a Chip (SoC).

11. The method of claim 7, wherein the processor and the MD form at least part of a system.

12. A Memory Device (MD) for storing temporary data designated for volatile storage by a processor and persistent data designated for non-volatile storage by the processor, the MD comprising:
   a volatile memory array;
   a Non-Volatile Memory (NVM) array; and
   a controller configured to:
      associate an address with a first location in the volatile memory array and with a second location in the NVM array, wherein the address is a byte address or a page address;
      receive a write command to write data in the MD for the address;
      write the data in the first location;
      flush the data from the first location to the second location; and
      reduce a refresh rate for the first location associated with the address as compared to other portions of the volatile memory array after flushing the data from the first location until after data is written again to the first location.

13. The MD of claim 12, wherein the volatile memory array includes an embedded Dynamic Random Access Memory (eDRAM).

14. The MD of claim 12, wherein the controller is further configured to:
set a volatility mode of operation for the MD based on an indication from the processor;
when the write command is performed while the volatility mode of operation is set to a volatile mode, ensure that an indication in a persistency data structure stored in an NVM location of the MD indicates that the MD does not store persistent data for the address after performing the write command; and
when the write command is performed while the volatility mode of operation is set to a persistent mode, ensure that the indication in the persistency data structure indicates that the MD stores persistent data for the address after performing the write command.

15. The MD of claim 14, wherein the controller is further configured to:
receive a read command for the address;
determine whether the MD stores persistent data for the address using the persistency data structure;
in response to determining that the data stored in the MD for the address is not persistent, perform the read command by returning the data stored in the first location or in the second location based on whether the data has been flushed from the first location to the second location since a last power-up of the MD; and
in response to determining that the data stored in the MD for the address is persistent, perform the read command by returning the data stored in the second location.

16. The MD of claim 12, wherein the controller is further configured to:
receive a get checkpoint command to retrieve checkpointed data for the address;
determine whether data stored in the second location is checkpointed data;
in response to determining that the data stored in the second location is checkpointed data, perform the get checkpoint command by returning the checkpointed data from the second location; and
in response to determining that the data stored in the second location is not checkpointed data, perform the get checkpoint command by returning data stored in the first location.

17. The MD of claim 12, wherein the controller is further configured to:
receive a command to start a transaction for a plurality of addresses;
checkpoint data for the plurality of addresses in the NVM array;
direct write commands for the plurality of addresses to respective first locations in the volatile memory array during the transaction;
direct read commands for the plurality of addresses to respective second locations in the NVM array during the transaction; and
in response to receiving a command to finish the transaction, copy the data for the plurality of addresses from the first locations in the volatile memory array to the corresponding second locations in the NVM array.

18. A processor, comprising:
an interface for communicating with a Memory Device (MD) that includes a volatile memory array and a Non-Volatile Memory (NVM) array, the MD configured to store temporary data designated for volatile storage and persistent data designated for non-volatile storage; and
control circuitry configured to:
designate a memory page in a virtual memory space as volatile or non-volatile based on data allocated to the memory page;
define a volatility mode of operation for the MD based on whether the memory page is designated as volatile or non-volatile; and
send a write command to the MD to write the data allocated to the memory page in the MD, wherein the defined volatility mode of operation is used by the MD to ensure that an indication in a persistency data structure stored in an NVM location of the MD indicates whether the MD stores persistent data for an address associated with the data after performing the write command, and
wherein the MD is further configured to associate the address with a first physical location in the volatile memory array and with a second physical location in the NVM array before receiving the write command.

19. The processor of claim 18, wherein the control circuitry is further configured to set the defined volatility mode of operation for the MD by sending a separate volatility mode command to the MD or by including an indication of the defined volatility mode with the command.

20. The processor of claim 18, wherein the control circuitry is further configured to send to the MD at least one of a checkpoint copy command to rollback data to an earlier state and a get checkpoint command to retrieve checkpointed data from the MD.

21. The processor of claim 18, wherein the processor forms part of a System on a Chip (SoC).

22. The processor of claim 18, wherein the processor and the MD form at least part of a system.

23. The processor of claim 18, wherein the MD is further configured to:
set the defined volatility mode of operation for the MD;
when the write command is performed while the defined volatility mode of operation is set to a volatile mode, ensure that the indication in the persistency data structure indicates that the MD does not store persistent data for the address after performing the write command; and
when the write command is performed while the defined volatility mode of operation is set to a persistent mode, ensure that the indication in the persistency data structure indicates that the MD stores persistent data for the address after performing the write command.

24. The processor of claim 18, wherein the MD is further configured to:
receive the write command to write the data in the MD for the address, wherein the address is a byte address or a page address;
write the data in the first physical location;
flush the data from the first physical location to the second physical location; and
reduce a refresh rate for the first physical location after flushing the data from the first physical location until after data is written again to the first physical location.

25. The processor of claim 18, wherein the MD is further configured to:
receive a read command for the address;
determine whether the MD stores persistent data for the address using the persistency data structure;
in response to determining that the data stored in the MD for the address is not persistent, perform the read command by returning the data stored in the first physical location or in the second physical location based on whether the data has been flushed from the first physical location to the second physical location since a last power-up of the MD; and
in response to determining that the data stored in the MD for the address is persistent, perform the read command by returning the data stored in the second physical location.

26. A non-transitory computer readable medium storing computer-executable instructions, wherein when the computer-executable instructions are executed by a controller of a Memory Device (MD), the computer-executable instructions cause the controller to:
associate an address with a first location in a volatile memory array of the MD and with a second location in a Non-Volatile Memory (NVM) array of the MD, wherein the address is a byte address or a page address;
receive a write command to write data in the MD for the address;
write the data in the first location;
flush the data from the first location to the second location; and
reduce a refresh rate for the first location associated with the address as compared to other portions of the volatile memory array after flushing the data from the first location until after data is written again to the first location.

27. A non-transitory computer readable medium storing computer-executable instructions, wherein when the computer-executable instructions are executed by a processor, the computer-executable instructions cause the processor to:
designate a memory page in a virtual memory space as volatile or non-volatile based on data allocated to the memory page;
define a volatility mode of operation for a Memory Device (MD) based on whether the memory page is designated as volatile or non-volatile; and
send a write command to the MD to write the data allocated to the memory page in the MD, wherein the defined volatility mode of operation is used by the MD to ensure that an indication in a persistency data structure stored in an NVM location of the MD indicates whether the MD stores persistent data for an address associated with the data after performing the write command, and
wherein the MD is configured to associate the address with a first physical location in the volatile memory array and with a second physical location in the NVM array before receiving the write command.

* * * * *